(12) United States Patent
Chen et al.

(10) Patent No.: US 7,985,296 B2
(45) Date of Patent: Jul. 26, 2011

(54) SAMPLE FIXING DEVICE OF EVAPORATION MACHINE

(76) Inventors: Ching-Ching Chen, Wugu Township, Taipei County (TW); Chen-Chun Hsu, Wugu Township, Taipei County (TW)

( * ) Notice: Subject to any disclaimer, the term of this patent is extended or adjusted under 35 U.S.C. 154(b) by 519 days.

(21) Appl. No.: 12/265,850

(22) Filed: Nov. 6, 2008

(65) Prior Publication Data

US 2010/0108504 A1 May 6, 2010

(51) Int. Cl.
*C23C 14/24* (2006.01)
*C23C 14/34* (2006.01)
*C23C 14/50* (2006.01)

(52) U.S. Cl. .... 118/730; 118/500; 118/503; 204/298.15

(58) Field of Classification Search ............. 204/298.15; 118/730, 500, 503
See application file for complete search history.

(56) References Cited

U.S. PATENT DOCUMENTS

| 4,034,704 A | * | 7/1977 | Wossner et al. | ............... 118/730 |
| 2007/0034148 A1 | * | 2/2007 | Lin | ......................... 204/298.15 |

FOREIGN PATENT DOCUMENTS

TW 1288963 10/2007

OTHER PUBLICATIONS

English Translation of TW-1288963 (by Applicant on Nov. 6, 2008 IDS).*

* cited by examiner

*Primary Examiner* — Mark F Huff
*Assistant Examiner* — John S Ruggles
(74) *Attorney, Agent, or Firm* — Chun-Ming Shih; HDLS IPR Services

(57) ABSTRACT

A sample fixing device of an evaporation machine includes a first transmission mechanism having a first rotation axis driven by a driving device and a first rotation wheel; a fixing plate and a support frame; a pair of second transmission mechanisms at opposite sides of the first rotation wheel, and including a second rotation wheel revolving around the first rotation wheel, a second rotation axis passing and attached to the second rotation wheel and the fixing plate, and a third rotation wheel connected to the second rotation axis; and a third transmission mechanism including a fourth rotation wheel driven by the third rotation wheel and a sample support axis passing and attached to the fourth wheel and the support arm; wherein an axes of the sample support axis perpendiculars to an extension axes of the first rotation axis so that the sample fixing device can rotate and revolve.

10 Claims, 4 Drawing Sheets

SAMPLE FIXING DEVICE OF EVAPORATION MACHINE

BACKGROUND

1. Field of the invention

The present invention relates to a fixing device, in particular, to a fixing device disposed in an interior of an evaporation machine for clamping a sample.

2. Description of the Prior Art

Surfaces of goods on the market such as decorations, dishware, or cutters, tools, molded semiconductor products, and so on, are deposited with nano-ions via physical vapor deposition (PVD) method for increasing its heat resistance, corrosion resistance, surface rigidity, and prolonging its lifespan. However, how to continuously and evenly deposit such nano-ions on surfaces of samples to greatly increase its mechanic characteristics and prolong its lifespan has become an important research topic for persons skilled in the art.

Taiwan patent no. I288963 applied by applicants of the present invention discloses a sample fixing device of an evaporation machine. The sample fixing device is disposed in an interior of the evaporation machine for arranging and fixing the sample, and includes a transmission mechanism and a fixing mechanism, wherein the transmission mechanism has a fixing axis and a transmission element attached to the fixing axis. The fixing mechanism has a rotation axis non-parallel to the fixing axis of the transmission mechanism, a support arm for fixing and supporting the rotation axis, and a rotation wheel driving the rotation axis and the support arm to revolve around the transmission mechanism. A rotation element and a fixing base are disposed at opposite ends of the rotation axis, respectively. The rotation element gear engages with the transmission element so that the fixing base generates a slantwise revolution.

However, in the aforesaid structure, there is still room for improvement in actual use of the sample fixing device, because the fixing base is suitable for insertion of lathy cutter such as axis, rod, and so on, but is not fit for discoid cutter, furthermore, the traditional sample fixing device can not completely deposit the entire dentate cutter and therefore effecting the partial rigidity of the cutter and accordingly decreases its service life.

BRIEF SUMMARY

The present invention provides a sample fixing device of an evaporation machine. The fixing device utilizes a driving device for driving a first transmission mechanism to rotate, and further utilizing the first transmission mechanism drive a pair of second transmission mechanisms and a third transmission mechanism to rotate, and finally driving a sample support axis of the third transmission mechanism to rotate, realizing the rotation and revolution of the sample fixing device.

The present sample fixing device of the evaporation machine is disposed to an interior of the evaporation machine and is driven to rotate and revolve by a driving device, the sample fixing device includes: a first transmission mechanism having a first rotation axis driven by the driving device, and a first rotation wheel connected to the first rotation axis; a support frame including a fixing plate and a support arm connected to the fixing plate, the fixing plate being parallel to an end face of the first rotation wheel; a pair of second transmission mechanisms respectively disposed at opposite sides of the first rotation wheel, and each including a second rotation wheel revolving around the first rotation wheel, a second rotation axis passing through and attached to the second rotation wheel and the fixing plate, and a third rotation wheel connected to the second rotation axis; and a third transmission mechanism including a fourth rotation wheel driven by the third rotation wheel, and a sample support axis passing through and attached to the fourth wheel and the support arm; wherein an axes line of the sample support axis perpendiculars to an extension axes line of the first rotation axis.

The present invention also provides a sample fixing device of an evaporation machine, which is arranged to a plurality of equidistant groups revolving around the driving device for keeping equilibrium condition of forces during rotation.

The present invention also provides an improved sample fixing device of an evaporation machine, which has a simple structure, low manufacturing cost and is easy to be repaired, to completely deposit the samples of complicate to evenly deposit, such as a side milling cutter, without un-deposited area, thereby increasing its universal usage and practicability.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed descriptions and technical measures of the present invention will become apparent with reference to the accompanying drawings. However, the drawings are merely for references and descriptions of the present invention, but not limit the present invention.

Figure 1:
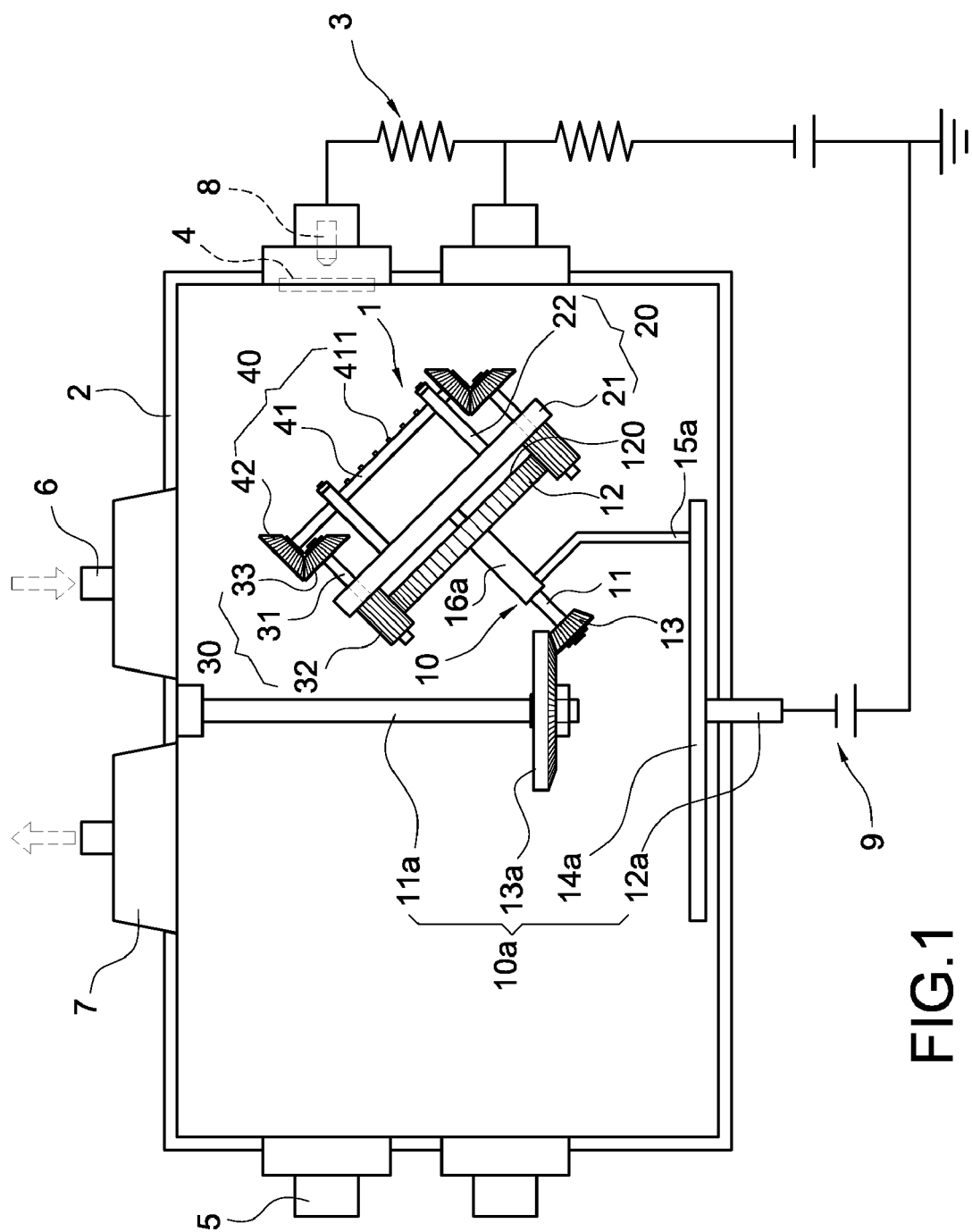
FIG. 1 is a schematic, assembled view of a first embodiment of the present invention and an evaporation machine.
Figure 2:
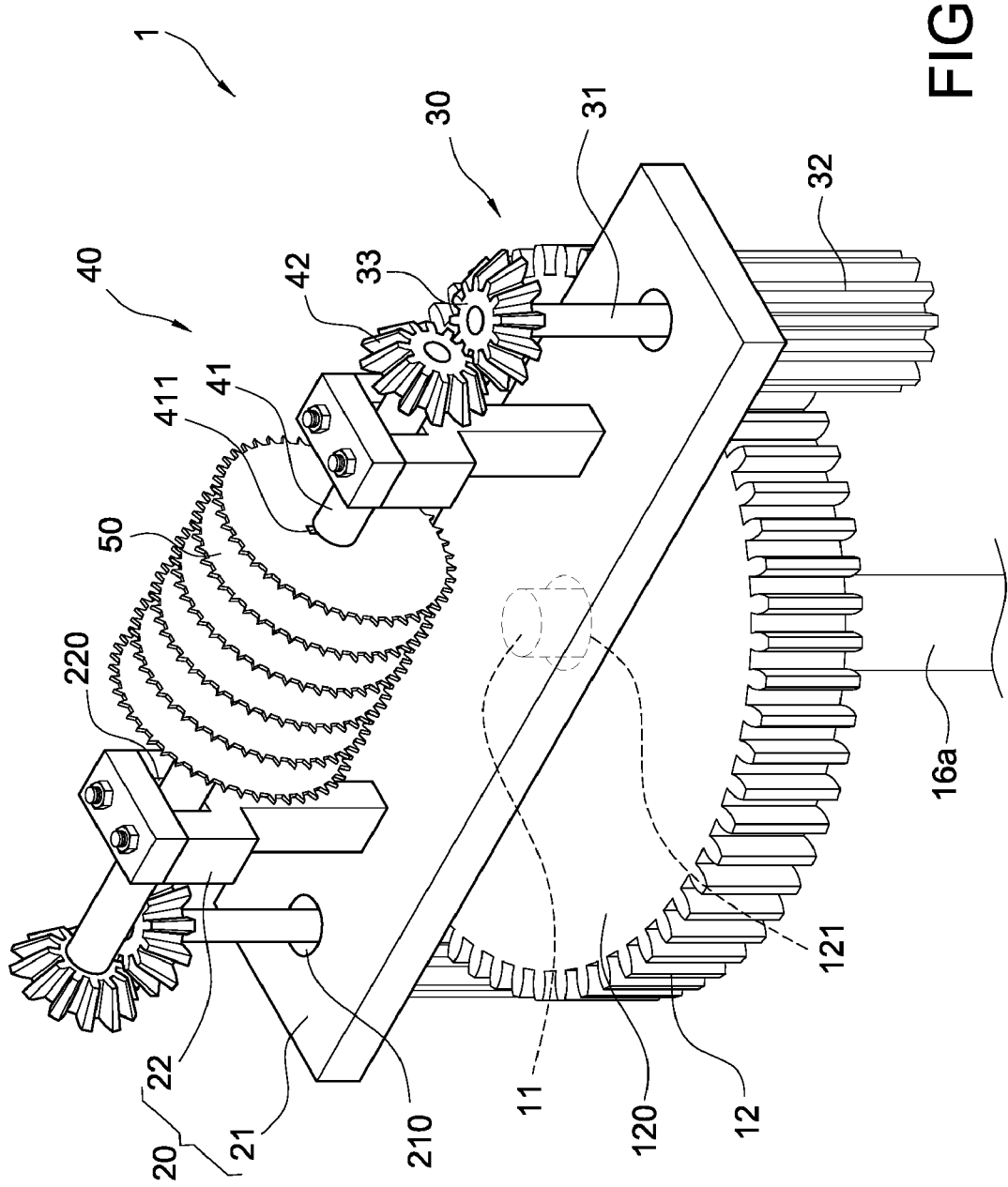
FIG. 2 is a schematic, partly assembled view of a support frame and a sample of FIG. 1.
Figure 3:
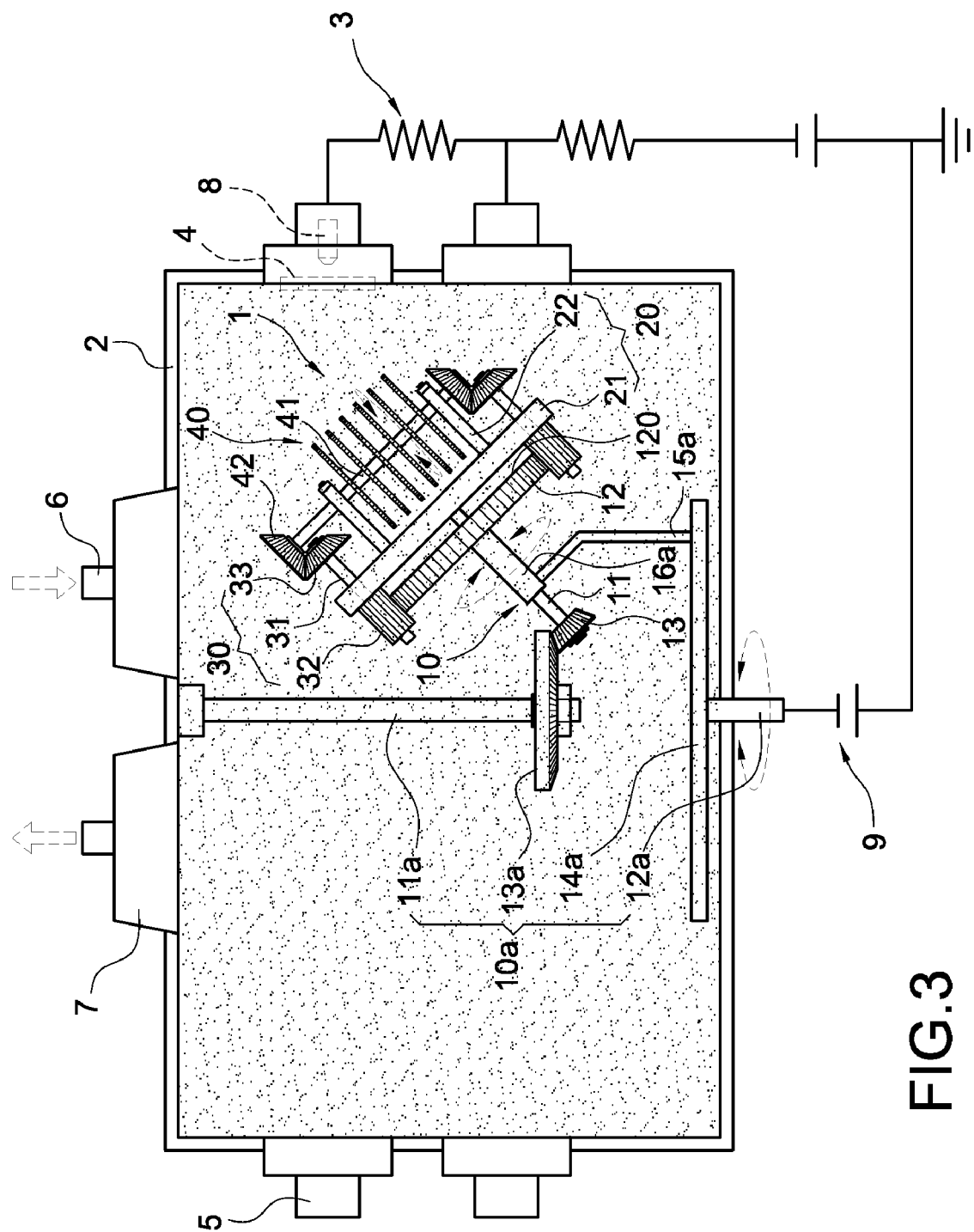
FIG. 3 is a schematic view showing a usage state of the first embodiment of the present invention to the evaporation machine.

Referring to FIGS. 1 to 3, the present invention provides an improved sample fixing device of an evaporation machine. According to the embodiment, the sample fixing device 1 is disposed to the interior of the evaporation machine 2 to fix and support a sample to be deposited. The sample fixing device 1 is driven and supported by a driving device 10a. The driving device 10a includes a fixing axis 11a and a pivot axis 12a. The fixing axis 11a is longitudinally and vertically fixed to an inner top surface of the evaporation machine 2, and a rotation wheel 13a is pivoted to one end of the fixing axis 11a. The pivot axis 12a connects to a driving device (not shown) such as a motor and electrically connects to a bias power supply 9 for driving a rotation wheel 14a and a fixing arm 15a connected to an outer periphery of the rotation wheel 14a. The rotation wheel 13a may be rotatable elements or devices such as a helical gear.

The sample fixing device 1 includes a first transmission mechanism 10, a support frame 20, a pair of second transmission mechanisms 30, and a third transmission mechanism 40. The first transmission mechanism 10 includes a first rotation axis 11 driven by the driving device 10a, and a first rotation wheel 12 connected to the first rotation axis 11. The first rotation axis 11 is non-parallel to the fixing axis 11a for movement transmission. Because the first rotation axis 11 is pivoted to the fixing arm 15a, the fixing arm 15a drives the first rotation axis 11 to revolve around the rotation axis 12a.

An engaged wheel 13 is pivoted to one end of the first rotation axis 11 and corresponding to the rotation wheel 13a. The rotation wheel 13a gear engages with the engaged wheel 13, driving the first rotation axis 11 to rotate so that the slantwise first rotation wheel 11 is driven to rotate. The first rotation wheel 12 has an axle hole 121 connected to a sleeve 16a of the fixing arm 15. The first rotation axis 11 passes through the sleeve 16a and the axle hole 121. The engaged wheel 13 may be a helical gear, while the first rotation wheel 12 may be rotatable elements or devices such as a spur gear.

The support frame 20 includes a fixing plate 21 and a support arm 22 connected to the fixing plate 21. The first rotation axis 11 passes through the axle hole 121 and unites to the fixing plate 21. The fixing plate 21 is pivoted to the first rotation axis 11 to rotate, and is parallel to an end face 120 of the first rotation wheel 12 and further has a perforation 210. Moreover, the support arm 22 has a receiving hole 220 defined therein.

The second transmission mechanisms 30 are respectively disposed at opposite sides of the first rotation wheel 12 for keeping balance. The second transmission mechanism 30 includes a second rotation wheel 32 revolving around the first rotation wheel 12, a second rotation axis 31 passing through and attached to the second rotation wheel 32 and the fixing plate 21, and a third rotation wheel 33 connected to the second rotation axis 31. The second rotation wheel 32 revolves around the first rotation wheel 12, and gear engages with the first rotation wheel 12 to drive the second rotation axis 31 to rotate. The second rotation axis 31 substantially parallels to the first rotation axis 11, passes through the perforation 210 and the fixing plate 21 and further connects to the fixing plate 21. The second rotation wheel 32 may be a spur gear, while the third rotation wheel 33 may be rotatable elements or devices such as a helical gear.

The third transmission mechanism 40 includes a fourth rotation wheel 42 driven by the third rotation wheel 33, and a sample support axis 41 passing through and attached to the fourth wheel 42 and the support arm 22. The third transmission mechanism 40 is disposed between the second transmission mechanisms 30 for movement transmission. The fourth rotation wheel 42 gear engages with the third rotation wheel 33, for driving the sample support axis 41 to rotate. The fourth rotation wheel 42 at one side of the sample support axis 41 is disposed at outside of the third rotation wheel 33, while the fourth rotation wheel 42 at the other side of the sample support axis 41 is disposed at inside of the third rotation wheel 33, so that the third transmission mechanism 40 disposed between the second transmission mechanisms 30 can be driven to rotate. The sample support axis 41 passes through the receiving hole 220 and the support arm 22, and further is attached to the support arm 22. An axes line of the sample support axis 41 perpendiculars to an extension axes line of the first rotation axis 11. The sample support axis 41 includes a plurality of locking blocks 411 for clamping the sample.

When the rotation axis 12a of the driving device 10a rotates, the rotation wheel 14a rotates accordingly, and the fixing arm 15a fixed at the outer periphery of the rotation wheel 14a starts to revolve, and drives the first rotation axis 11 to revolve around the rotation axis 12a, the gear engagement rotation of the engaged wheel 13 and the rotation wheel 13a drives the first and the second rotate axis 11 and 12 to rotate, the second rotation wheel 32 revolves around the first rotation wheel 12 to drive the second rotation axis 31 and the third rotation wheel 33 to rotate, and finally drives the fourth rotation wheel 42 to rotate and further drives the sample support axis 41 for clamping the sample to rotate.

FIG. 2 is a schematic, assembled view showing the third transmission mechanism clamping the sample. Opposite sides of the sample support axis 41 each has a support arm 22, and the support arm 22 has a receiving hole 220, allowing the sample support axis 41 passing through and supporting the sample support axis 41. The sample support axis 41 has a plurality of locking blocks 411, for clamping and positioning a sample with locating grooves such as a side milling cutter 50 thereon. The support arm 22 is fixed to the fixing plate 21 so that the sample is more steadily placed thereon.

FIG. 3 is an explanation view showing a first embodiment of the present invention being applied to an evaporation machine. When used, the sample such as the side milling cutter 50 with locating grooves, or drills, or other cutters of different shapes and sizes, is positioned on the sample support axis 41, while the evaporation machine 2 includes an arc power supply 3, a sputtering target 4, an ion device 5, a gas entrance 6 and a gas exhausting device 7, the arc power supply 3 connects to an arc charger 8, the ion device 5 is an ion gun, and the gas exhausting device 7 is a pump, after the interior of the evaporation machine 2 is vacuumed, different temperatures are provided according to different characteristics of different samples, the ion device 5 sends ions to clean the surface of the sample, the arc charger 8 sputters nano-ions from the sputtering target 4 along a parabola direction, and the nano-ions dealt by the arc is further thinned by the ion device 5, while the side milling cutter 50 slantingly rotate along the drop direction of the nano-ions, including the revolution around the rotation axis 12a and the rotation generated by the first rotation axis 11 and the sample support axis 41, so that the nano-ions are evenly and continuously deposited on the surface of the side milling cutter 50, finally, nitrogen and carbon containing gas is filled through the gas entrance 6 and the entire device is cooled to accomplish the deposition operation.

Figure 4:
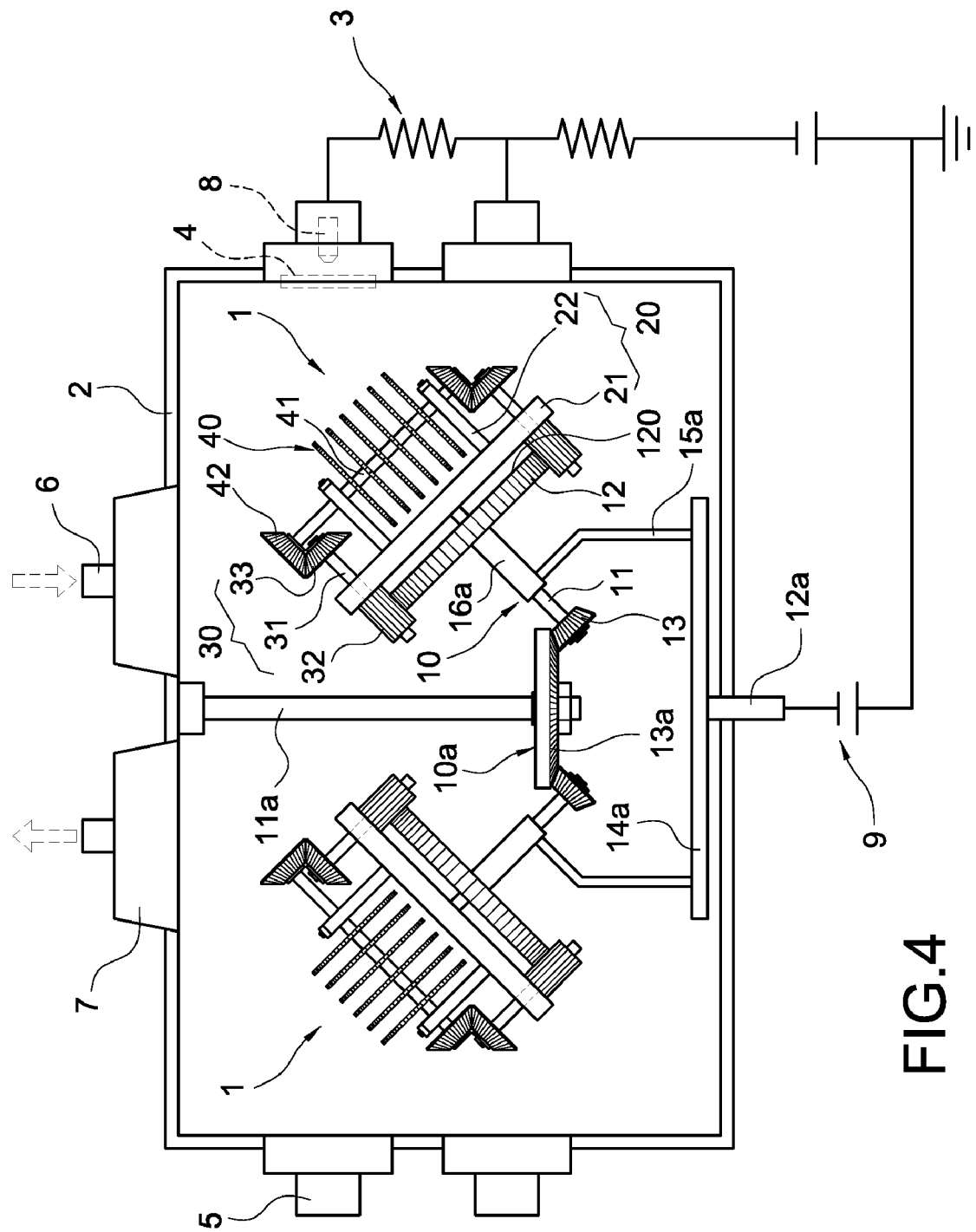
FIG. 4 is a schematic, assembled view of a second embodiment of the present invention and an evaporation machine.

FIG. 4 is a schematic, assembled view of a second embodiment of the present invention and an evaporation machine. The sample fixing device 1 of the present invention may not only be arranged to a single group according to the first embodiment, but may also be arranged to compose a plurality groups rotating and revolving around the rotation axis 12a. The sample fixing devices are equidistantly and correspondingly arranged, obtaining equilibrium condition of forces during rotation and increasing its production speed.

The present sample fixing device of the physical vapor deposit evaporation machine not only improves shortcomings of the traditional sample fixing device, but also has the following advantages: because the sample support axis 41 slantingly rotates and revolves, it directly catches the nano-ions dropped along the parabola direction, so that the nano-ions are continuously and evenly deposited on the sample surface; furthermore, the present sample fixing device has a simple structure, a low manufacturing cost, and is easy to be repaired; moreover, the samples of complicate to deposit by traditional techniques, such as side milling cutter, can be completely deposited without un-deposited area by using the present sample fixing device, thereby increasing the universal usage and practicability of the present invention.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A sample fixing device of an evaporation machine being disposed in an interior of the evaporation machine and being driven to rotate and revolve by a driving device, the sample fixing device comprising:

a first transmission mechanism comprising a first rotation axis driven by the driving device, and a first rotation wheel connected to the first rotation axis;

a support frame comprising a fixing plate and a pair of support arms connected to the fixing plate, the fixing plate being parallel to an end face of the first rotation wheel;

a pair of second transmission mechanisms respectively disposed at opposite sides of the first rotation wheel, each of the second transmission mechanisms comprising a second rotation wheel revolving around the first rotation wheel, a second rotation axis passing through the fixing plate and attached to the second rotation wheel, and a third rotation wheel connected to the second rotation axis; and a third transmission mechanism comprising a pair of fourth rotation wheels, each driven by the corresponding third rotation wheel, and a sample support axis passing through the support arms and attached to the fourth rotation wheels;

wherein an axis line of the sample support axis is perpendicular to an extension axis line of the first rotation axis.

2. The sample fixing device as described in claim 1, wherein both of the first and second rotation wheels are spur gears.

3. The sample fixing device as described in claim 1, wherein both of the third and the fourth rotation wheels are helical gears.

4. The sample fixing device as described in claim 1, wherein the driving device comprises a fixing arm, a sleeve being attached to the fixing arm, allowing the first rotation axis to pass through and pivot inside the sleeve.

5. The sample fixing device as described in claim 1, wherein the driving device comprises a rotation wheel, the first transmission mechanism comprising a corresponding engaged wheel connected to the first rotation axis, the rotation wheel being a gear engaging with the engaged wheel for driving the first rotation axis to rotate.

6. The sample fixing device as described in claim 1, wherein the fixing plate has a pair of perforations, each second rotation axis passing through one of the perforations in the fixing plate.

7. The sample fixing device as described in claim 1, wherein each second rotation axis perpendicularly passes through and connects to the fixing plate.

8. The sample fixing device as described in claim 1, wherein each support arm has a receiving hole, the sample support axis passing through the receiving hole of each support arm, and further being supported by both support arms.

9. The sample fixing device as described in claim 1, wherein the sample support axis comprises a plurality of locking blocks, each for clamping and positioning a sample.

10. The sample fixing device as described in claim 1 comprising a plurality of equidistant sample groups, each sample group supported in a separate sample fixing device.

* * * * *